Oct. 3, 1967

M. GYI 3,345,576

SIMPLIFIED PULSE COUNTER FM DEMODULATOR

Filed Oct. 9, 1964

2 Sheets-Sheet 1

MAUNG (NMI) GYI
INVENTOR.

BY James H. Griffin
ATTORNEY

MAUNG (NMI) GYI
INVENTOR.
BY James H. Griffin
ATTORNEY 3,345,576
SIMPLIFIED PULSE COUNTER FM DEMODULATOR Maung Gyi, South San Francisco, Calif., assignor to Ampex Corporation, Redwood City, Calif., a corporation of California Filed Oct. 9, 1964, Ser. No. 402,972
2 Claims. (Cl. 329—103)

ABSTRACT OF THE DISCLOSURE

An FM demodulator of the type wherein position modulated pulses are produced in correspondence with zero crossings of an FM waveform to be demodulated, and the pulses are integrated to provide the corresponding AM waveform. Only the pulses corresponding to alternate zero crossings are utilized in the demodulation process, and the demodulator circuit is correspondingly relatively simple. The demodulator circuit includes provision for maximizing the power in the integrated output AM waveform.

Figure 1:
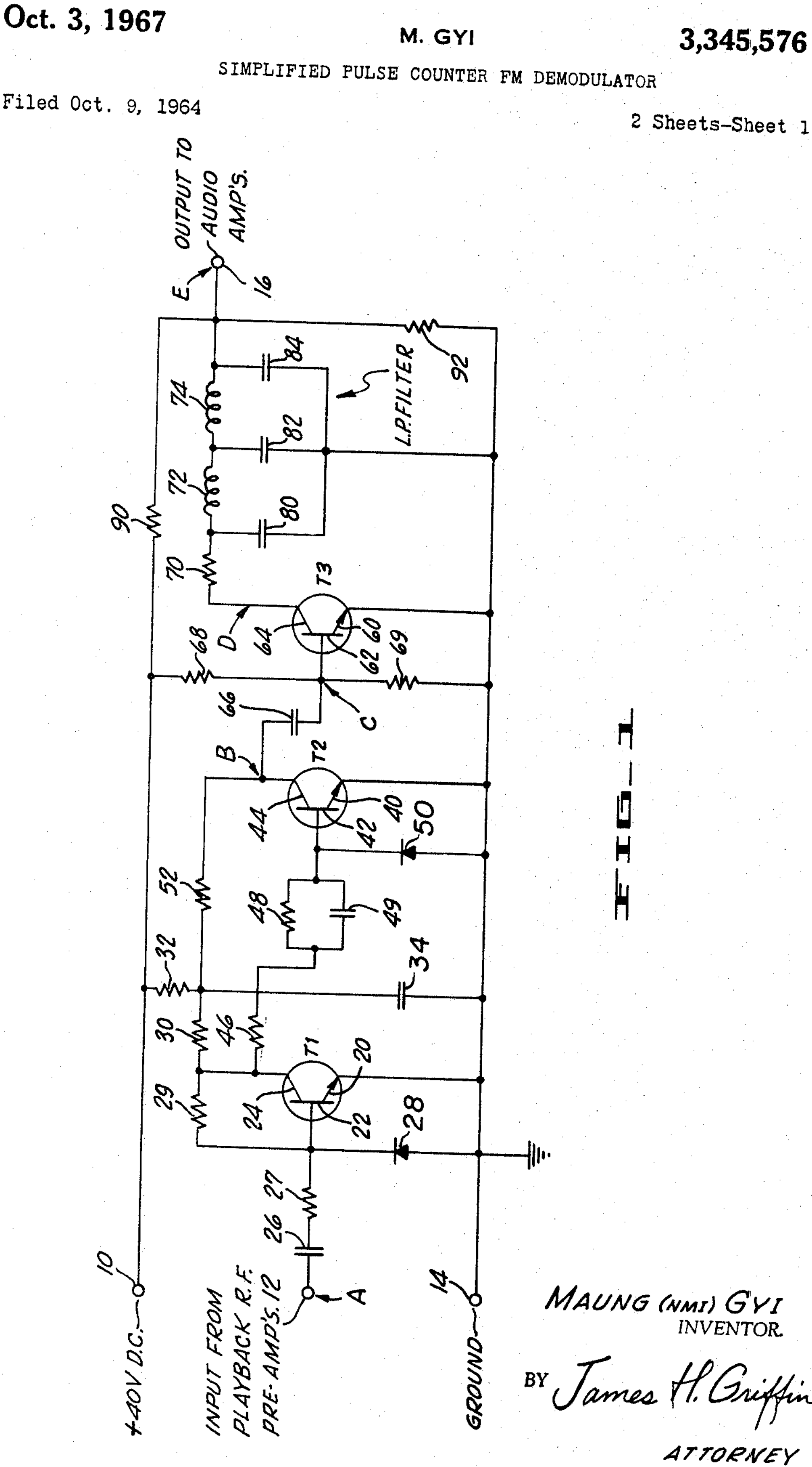

This invention relates to frequency modulation (FM) demodulators and more particularly to FM demodulators for audio frequency signals and all other FM systems where there are more than two samples per cycle of the signal being transmitted.

Applicant's demodulator circuit will be described in connection with magnetic tape recorders, but it is to be understood that the inventive principle applies also to radios, televisions, and other types of recording. In recent years, FM demodulation has been accomplished by the so-called "pulse count" method, circuitry for which is shown and described in U.S. application 214,333, filed in the name of Paul E. Drapkin and assigned to Ampex Corporation, and which issued Jan. 25, 1966 as U.S. Patent No. 3,231,824. A pulse counter demodulator must convert variable-width FM square waves from a limiter into pulses of a uniform width but position modulated. Although this function has been performed well by circuits of the type referred to above, such circuits have generally been provided in a push-pull configuration and consequently included a relatively great number of expensive components which must be carefully matched between balanced sides of the circuit. In addition, a push-pull pulse counter demodulator must generally be preceded by an expensive and sensitive limiter in order to provide a balanced input signal.

It is, therefore, a general object of this invention to provide an improved FM demodulator.

Another object of this invention is to reduce the effect of incidental asymmetrical limiting on the output signal.

Other objects of this invention are to provide an inexpensive FM demodulator, to eliminate the input transformer required by prior demodulators, to provide a demodulator that is not of the push-pull pulse counter variety, thus cutting down on the number of components required, and to eliminate the balance problems associated with push-pull circuitry.

Another object of this invention is to provide an FM demodulator that does not require the sensitivity and balance of limiting heretofore necessary.

Another object of this invention is to provide an FM demodulator which does not require adjustment or balancing and in which transistor matching and aging are not important factors.

In the achievement of the above and other objects and as a feature of applicant's invention, there is provided an FM demodulator circuit wherein a frequency modulated input signal is limited in a minimum number of stages of amplification and limiting and then is differentiated. Selected portions of the differentiated waveform are applied to switch an active switching element, and the output of the active switching element is integrated in a low-pass filter to provide an amplitude modulated (AM) output signal.

As another feature of applicant's invention, the above-mentioned differentiating function is performed by a capacitor or other element so selected that it keeps the active element switched on almost until the next differentiation could be expected to be performed, thus increasing the amount of power in the filtered output waveform.

Figure 2:
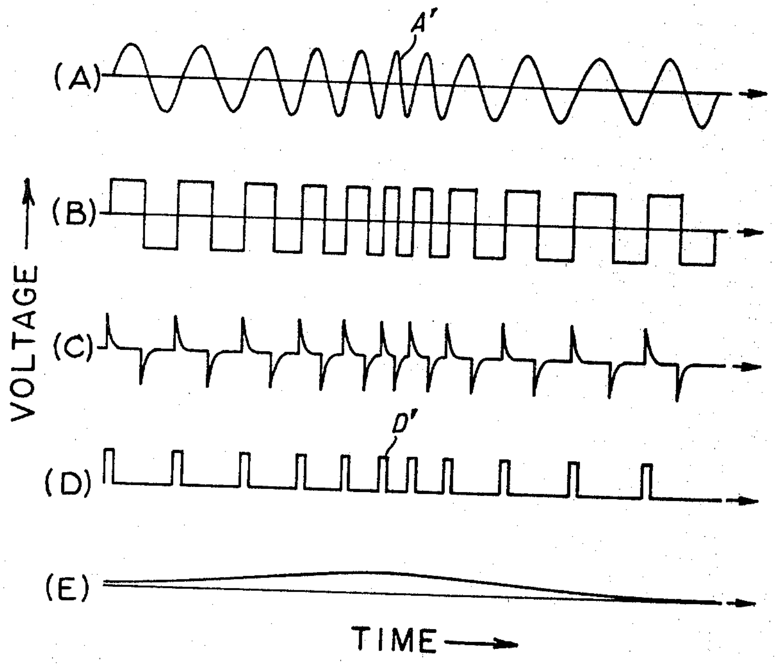

Other objects and features of applicant's invention and a fuller understanding thereof may be had by referring to the following description and claims taken in conjunction with the accompanying drawings in which:

FIGURE 1 shows a circuit which embodies the principles of applicant's invention; and FIGURE 2 shows waveforms occurring at various points in the operation of the circuit of FIGURE 1.

Referring to FIGURE 1, in which there is shown schematically a circuit which is a preferred embodiment of applicant's invention, the circuit illustrated therein has a positive power supply terminal 10, an input terminal 12, a ground terminal 14, and an output terminal 16. For purposes of illustration, the positive power supply 10 is specified as being +40 volts DC. The signal applied between the input terminal 12 and the ground terminal 14 is an FM signal (FIGURE 2, waveform A) which has been through the transducing and preamplifying stages in the FM receiver.

A transistor T1 having emitter 20, base 22, and collector 24 receives the FM signal A on the input terminal 12 at its base 22 through a coupling capacitor 26 and an impedance-providing resistor 27 in series. A diode 28 is coupled between the base 22 and ground 14 to provide limiting of the input FM signal. A resistor 29 coupled between the base 22 and the collector 24 helps maintain the transistor T1 at the proper operating point. The emitter 20 of the transistor T1 is directly connected to ground 14. The collector 24 of the transistor T1 is coupled through a resistor 30 and a resistor 32 in series to the positive power supply 10. The junction between the resistor 30 and the resistor 32 is decoupled to ground through a capacitor 34. A transistor T2 having emitter 40, base 42, and collector 44 has its emitter 40 directly connected to ground. Signals from the collector 24 of the transistor T1 are coupled to the base 42 of the transistor T2 through a resistor 46 in series with the parallel combination of a resistor 48 and a capacitor 49. A second limiter diode 50 is directly coupled between the base 42 of the transistor T2 and ground 14. A resistor 52 is coupled between the collector 44 of the transistor T2 and the junction between the resistors 30 and 32. The transistors T1 and T2 and the diodes 28 and 50 and the other above mentioned components serve to provide two stages of limiting for the input signal appearing at the terminal 12; the resulting limited FM signal is shown at FIGURE 2B.

The waveform B is applied to an RC differentiating network comprising a capacitor 66 and a resistor 69. Since the amplitude and leading edge slopes of the limited FM pulses shown at FIGURE 2B are uniform, the differentiated output produced therefrom by the capacitor 66 will be of uniform size (FIGURE 2, waveform C). As a feature of applicant's invention, the capacitor 66 (or other differentiating means used in its place) is so selected that the differentiated output (the waveform C transient) will last almost the full period of the FM input signal A when it is at its highest frequency, as shown at A', thus providing maximum energy transmission by the active element switched by the waveform C, consistent with non-overlap of each new individual transient produced by RC network 66, 69.

A transistor T3 having emitter 60, base 62, and collector 64 has its base 62 coupled to the differentiating capacitor 66 and through a resistor 68 to the positive power supply and through the resistor 69 to ground 14. The emitter 60 is directly connected to ground 14. Thus, the differentiated waveforms shown at FIGURE 2C are applied to the base 62 of the transistor T3 causing it to switch on for a uniform length of time in response either to the positive-going (corresponding to the leading edges of the limited FM pulses shown in FIGURE 2B) differentiated pulses. Of course, by a simple change of transistors or rearrangement thereof, the transistor could be made to conduct in response to the negative-going (corresponding to the trailing edges of the limited FM pulses shown in FIGURE 2B) differentiated pulses. The result of the periodic firing of the transistor T3 by the differentiated pulses shown in FIGURE 2C is the waveform shown in FIGURE 2D, consisting of pulses of uniform width (and maximum duration (if the capacitor 66 is selected properly) but "position-modulated," that is to say, appearing with varied spacing relative to each other depending on the input FM signal.

The pulses 2D appearing on the collector 64 of the transistor T3 are applied through a resistor 70 to a low pass filter comprising two inductors 72 and 74 and three capacitors 80, 82, and 84. The low pass filter integrates the waveform 2D into an AM output waveform as shown in FIGURE 2, waveform E. The output of the low pass filter is applied to the output terminal 16 of the circuit. A resistor 90 coupled to the output terminal 16 and the positive power supply 10 and a resistor 92 coupled between the output terminal 16 and ground 14 ensure that the circuit disclosed herein has a proper output impedance for the circuitry to follow.

An FM demodulator in accordance with the above description and drawing was built and operated using the following components:

*Voltage*

| | |
|---|---|
| **10** | v. D.C. +40 |

*Transistors*

| | |
|---|---|
| T1 | 2N1308 |
| T2 | 2N1308 |
| T3 | 2N706 |

*Diodes*

| | |
|---|---|
| **28** | 1N279 |
| **50** | 1N279 |

*Resistors (ohms)*

| | |
|---|---|
| **27** | 300 |
| **29** | 47K |
| **30** | 1K |
| **32** | 2K |
| **46** | 1K |
| **48** | 15K |
| **52** | 1K |
| **68** | 27K |
| **69** | 270 |
| **70** | 360 |

*Capacitors (microfarads)*

| | |
|---|---|
| **26** | 0.1 |
| **34** | 10 |
| **49** | 0.01 |
| **66** | $1000\times10^{-6}$ |
| **80** | .022 |
| **82** | .056 |
| **84** | .022 |

*Inductors (microhenries)*

| | |
|---|---|
| **72** | 6800 |
| **74** | 6800 |

The above specified circuit has an output impedance of about 350 ohms. The center frequency of the input signal waveform A was 100 kc.; its deviation is ±50 kc.

Thus, applicant has achieved an improved FM demodulator which is inexpensive to build due to its small number of components, independence of balance, and other such refinements.

A number of alternative arrangements will readily suggest themselves to those skilled in the art. For example, N-P-N conductivity type transistors and P-N-P conductivity type transistors may be interchanged, if only the power supply, biasing elements, and other circuit components are appropriately reversed. However, although the invention has been described with a certain degree of particularity, it is to be understood that the present disclosure has been made only by way of example and that numerous changes in the details of construction and the combination and arrangement of parts may be resorted to without departing from the spirit and the scope of the invention as hereinafter claimed.

What is claimed is:

1. An FM demodulator having a power supply terminal, an input terminal, a ground terminal, an output terminal, a differentiating capacitor coupled to the input terminal, a transistor having emitter, base, and collector, the base of the transistor being coupled to the differentiating capacitor and being coupled through a first resistor to the power supply terminal and through a second resistor to the ground terminal, the emitter of the transistor being coupled to the ground terminal, the collector of the transistor being coupled through the series combination of a third resistor and first and second inductors to the output terminal, a first capacitor connected from the junction between the third resistor and the first inductor to the ground terminal, a second capacitor connected from the junction between the first inductor and the second inductor to the ground terminal, and a third capacitor connected from the output terminal to the ground terminal, a fourth resistor coupled between the output terminal and the power supply terminal, a fifth resistor coupled between the output terminal and the ground terminal.

2. An FM demodulator having a power supply terminal, an input terminal upon which there is imposed a frequency modulated (FM) signal comprising a carrier wave modulated by an information signal, a ground terminal, an output terminal, a differentiating capacitor coupled to the input terminal, a transistor having emitter, base, and collector, the base of the transistor being coupled to the differentiating capacitor and being coupled through a first resistor to the power supply terminal and through a second resistor to the ground terminal, the emitter of the transistor being coupled to the ground terminal, the collector of the transistor being coupled through the series combination of a third resistor and first and second inductors to the output terminal, a first capacitor connected from the junction between the third resistor and the first inductor to the ground terminal, a second capacitor connected from the junction between the first inductor and the second inductor to the ground terminal, and a third capacitor connected from the output terminal to the ground terminal, a fourth resistor coupled between the output terminal and the power supply terminal, a fifth resistor coupled between the output terminal and the ground terminal, said demodulator being further characterized in that said differentiating capacitor is of such value that the transistor is switched on for the maximum amount of time possible without requiring overlapping of the successive differentiated pulses from the differentiating capacitor when the FM carrier is modulated with the highest expectable frequency of information signal.

References Cited

UNITED STATES PATENTS

| | | | |
|---|---|---|---|
| 2,900,532 | 8/1959 | Barnes | 329—127 X |
| 3,048,789 | 8/1962 | Herzog | 329—103 X |
| 3,258,701 | 6/1966 | Howard | 329—103 |

ALFRED L. BRODY, *Primary Examiner.*